United States Patent [19]
Ikemoto

[11] Patent Number: 5,912,808
[45] Date of Patent: Jun. 15, 1999

[54] SEMICONDUCTOR COMPONENT

[75] Inventor: Masahiko Ikemoto, Tokyo, Japan

[73] Assignee: Mitsubishi Denki Kabushiki Kaisha, Tokyo, Japan

[21] Appl. No.: 08/984,423

[22] Filed: Dec. 3, 1997

[30] Foreign Application Priority Data

Aug. 11, 1997 [JP] Japan ................................. 9-216660

[51] Int. Cl.⁶ .............................. H01L 25/00; H05K 1/14
[52] U.S. Cl. ..................... 361/777; 361/728; 361/736; 361/764; 361/765; 361/778; 361/783; 361/807; 257/723; 257/724; 257/676; 257/678; 257/686
[58] Field of Search .................................. 361/777, 715, 361/728, 736, 764, 765, 778, 783, 807; 257/723, 724, 676, 678, 686

[56] References Cited

U.S. PATENT DOCUMENTS

| | | | |
|---|---|---|---|
| 5,083,189 | 1/1992 | Sawaya | 257/791 |
| 5,138,438 | 8/1992 | Masayuki et al. | 257/686 |
| 5,412,538 | 5/1995 | Kikinis et al. | 361/792 |
| 5,471,369 | 11/1995 | Honda et al. | 361/813 |
| 5,780,926 | 7/1998 | Seo | 257/676 |

FOREIGN PATENT DOCUMENTS

| | | |
|---|---|---|
| A 2-63150 | 3/1990 | Japan . |
| A 5-183094 | 7/1993 | Japan . |

*Primary Examiner*—Leo P. Picard
*Assistant Examiner*—David Foster
*Attorney, Agent, or Firm*—Burns, Doane, Swecker & Mathis, LLP

[57] ABSTRACT

A microcomputer module 21 and a memory module 31 are mounted on a mounting substrate 42 in such a manner that first outer leads 23 of the microcomputer module 21 and first outer leads 33 of the memory module 31 are connected together in an overlapped manner.

10 Claims, 18 Drawing Sheets

SEMICONDUCTOR COMPONENT

BACKGROUND OF THE INVENTION

1. Field of the Invention

The present invention relates to a semiconductor component.

2. Description of the Prior Art

Recently, home electric appliances and information devices have been made smaller in size in quick tempo up to the degree which permits the users to carry them. One of the factors which have promoted such reduction in size of home electric appliances and information devices is a single chip microcomputer. The single chip microcomputer comprises a central processing unit (hereinafter referred to as "CPU"), memories such as ROM and RAM, and such functional circuits as timers, all of which are formed on a single semiconductor chip. The use of the single chip microcomputer has promoted the reduction in size of a mounting substrate and of home electric appliances and information devices.

However, for small-sized devices requiring large capacities of memories, which have recently been developed positively, there is adopted a method in which a CPU and a memory of a large capacity are mounted on separate semiconductor chips, then the semiconductor chip ("CPU chip" hereinafter) provided with the CPU is packaged into a microcomputer module, likewise the semiconductor chip ("memory chip" hereinafter) provided with the large-capacity memory is packaged into a large-capacity memory module ("memory module" hereinafter), then the microcomputer module and the memory module are mounted onto a mounting substrate, and both modules are connected with each other through wiring formed on the upper surface of the mounting substrate. This is because as the memory capacity increases, the area occupied by memory becomes larger and it becomes impossible to provide both large-capacity memory and CPU on one semiconductor chip.

FIG. 16 is a perspective view showing the construction of a conventional IC module, in which are illustrated both microcomputer module and memory module. In the same figure, the reference numeral 121 denotes a microcomputer module and the numeral 131 denotes a memory module. The microcomputer module 121 plays the role of controlling a small-sized device, while the memory module 131 plays the role of storing data necessary for the control of the small-sized device made by the microcomputer module 121.

Numeral 122 denotes the body of the microcomputer module. Numeral 123 denotes a first outer lead for connection between the modules, the first outer lead 123 being provided plurally on the microcomputer module body 122 and drawn out to the exterior from a side face of the body 122 up to a position flush with the underside of the body 122. Numeral 124 denotes a second outer lead provided plurally on the microcomputer module body 122 and drawn out to the exterior from side faces of the body 122 up to positions flush with the underside of the body 122. The first outer leads 123 permit the microcomputer module 121 to receive data from the memory module 131 and permit the microcomputer module 121 to transmit a control signal to the memory module 131 for controlling the operation of the module 131. The second outer leads 124 permit the microcomputer module 121 to be supplied with electric power and permit the same module to receive and transmit information signals from and to the exterior of the small-sized device.

Numeral 132 denotes the body of the memory module. Numeral 133 denotes a first outer lead for connection between both modules, the first outer lead 133 being provided plurally on the memory module body 132 and drawn out to the exterior from a side face of the body 132 up to a position flush with the underside of the body 132. Numeral 134 denotes a second outer lead provided plurally on the memory module body 132 and drawn out to the exterior from side faces of the body 132 up to positions flush with the underside of the body 132. The first outer leads 133 permit the memory module 131 to receive a control signal from the microcomputer module 121 and transmit data to the module 121. The second outer leads 134 permit the memory module 131 to be supplied with electric power and permit the same module to receive an information signal from the exterior of the small-sized device.

The CPU chip sealed in the microcomputer module body 122 and the first and second outer leads 123, 124 are electrically connected with each other. Likewise, the memory chip sealed in the memory module body 132 and the first and second outer leads 133, 134 are electrically connected with each other.

FIG. 17 is a perspective view showing the construction of a conventional semiconductor component. The semiconductor component shown therein comprises the microcomputer module and the memory module both illustrated in FIG. 16 and both mounted on a mounting substrate. The numeral 141 in FIG. 17 represents the semiconductor component.

Numeral 142 denotes a mounting substrate. Numeral 143 denotes a connecting wire formed on the upper surface of the mounting substrate 142. The connecting wire 143 connects the portion where the first outer leads 123 of the microcomputer module 121 contacts the upper surface of the mounting substrate 142 with the portion where the first outer leads 133 of the memory module 131 opposed thereto contacts the upper surface of the substrate 142. The other constituent elements are the same as those indicated by the same reference numerals in FIG. 16, so detailed explanations thereof are here omitted.

The conventional semiconductor component 141 illustrated in FIG. 17 is constructed as follows. The microcomputer module 121 and the memory module 131 are mounted on the substrate 142 at the shortest distance between both modules. Then, the portion where the first outer leads 123 of the microcomputer module 121 contacts the upper surface of the substrate 142 and the portion where the outer leads 133 of the memory module 131 opposed thereto contact the upper surface of the substrate 142 are connected with each other by using the connecting wires 143 formed on the upper surface of the substrate 142.

Reference will be made below to the operation of such conventional semiconductor component.

Main operations are as follows. The microcomputer module 121 transmits a control signal for controlling the operation of the memory module 131 to the memory module through the first outer leads 133. The memory module 131 receives the control signal through the first outer leads 133. In accordance with this control signal the memory module 121 operates and transmits data to the microcomputer module 121 through the first outer leads 133, which data is necessary for the microcomputer module 121 to control the small-sized device. The microcomputer module 121 receives the data through the first outer leads 123. In accordance with this data the microcomputer module 121 controls the small-sized device and transmits an information signal to the exterior of the device through the second outer leads 124.

SUMMARY OF THE INVENTION

The conventional IC modules are constructed as above, so in the case where two IC modules are mounted on a mounting substrate to constitute a semiconductor component, the portion where the first outer leads of one IC module contact the upper surface of the mounting substrate and the portion where the first outer leads of the other IC module opposed thereto contact the upper surface of the substrate are connected with each other using connecting wires formed on the substrate upper surface. Therefore, it is necessary to ensure a space for the connecting wires on the upper surface of the substrate. This connecting wire area has so far been a great obstacle to a further reduction in size of home electric appliances and information devices.

The conventional semiconductor components are constructed as above, therefore, it is necessary to form connecting wires on the upper surface of the mounting substrate. These connecting wires have so far been a great obstacle to a further reduction in size of home electric appliances and information devices.

A method for solving the above-mentioned problem is disclosed, for example, in JP-A No. 2-63150. FIG. 18 is a perspective view showing the construction of a conventional IC module which is shown in JP-A No. 2-63150. In the same figure, the numeral 151 denotes an IC module.

Further, the numeral 152 denotes the body of the IC module. Numeral 153 denotes a first outer lead provided plurally on one of two opposed side faces of the IC module body 152. The first outer leads 153 are drawn out to the exterior from the one side face of the body 152 and their front ends are bent upward. Numeral 154 denotes a second outer lead provided plurally on the other side face of the IC module body 152. The second outer leads 154 are drawn out to the exterior from the other side face and their front ends are bent downward.

FIG. 19 is a side view showing the construction of a conventional semiconductor component disclosed in JP-A No. 2-63150. In FIG. 19 there is shown a semiconductor component assembled by mounting three such IC modules as shown in FIG. 18 onto a mounting substrate. In the same figure, the numeral 161 represents the semiconductor component.

Numeral 162 denotes a mounting substrate, and numeral 163 denotes an electric connection connected to the first and second outer leads 153, 154. The other constituent elements are the same as those indicated by the same reference numerals in FIG. 18, so detailed explanations thereof are here omitted.

According to the construction of the conventional semiconductor component 161 shown in FIG. 19, the IC modules 151 are mounted on the mounting substrate 162 in such a manner that the first outer leads 153 of one of two adjacent IC modules and the second outer leads 154 of the other IC module are engaged and connected with each other on the electric connection 163 formed on the upper surface of the mounting substrate 162, and the engaged and connected portion of both leads 153 and 154 is connected to the electric connection 163 using solder for sample.

Since the conventional IC module disclosed in JP-A No. 2-63150 is constructed as above, it is not necessary to ensure the space for the connecting wires on the surface of the mounting substrate. Therefore, the foregoing problem ascribable to the connecting wire area does not occur. However, in the case where two such conventional IC modules as shown in JP-A No. 2-63150 are mounted onto a mounting substrate to constitute a semiconductor component, the portion ("outer lead connection" hereinafter) where the first outer leads of one IC module and the second outer leads of the other IC module are engaged and connected with each other is connected to an electric connection formed on the upper surface of the mounting substrate, using solder for example. Therefore, in the case of mounting the two IC modules onto the substrate to constitute a semiconductor component, there is a fear that solder or the like may flow on the upper surface of the substrate and that consequently adjacent outer lead connections may be connected together. There has been the same fear also in the case of correcting a poor connection between the first outer leads of one IC module and the second outer leads of the other IC module.

Since the conventional semiconductor component disclosed in JP-A No. 2-63150 is constructed as above, it is not necessary to form connecting wires on the upper surface of the mounting substrate and hence there does not arise the foregoing problem based on connecting wires. According to the conventional semiconductor component in question, however, the portion (outer lead connection) where the first outer leads of one of two adjacent IC modules and the second outer leads of the other IC module is connected to an electric connection provided on the upper surface of the mounting substrate by the use of solder or the like. Consequently, there is a fear that adjacent outer lead connections may be connected together. There has been the same fear also in the case of correcting a poor connection between the first outer leads of one of two IC modules and the second outer leads of the other IC module.

The present invention has been accomplished for solving the above-mentioned problems and it is an object of the invention to provide a semiconductor component capable of contributing to a further reduction in size of home electric appliances and information devices.

It is another object of the present invention to provide a semiconductor component high in reliability of the connection between two IC modules and capable of easily correcting a poor connection between two IC modules.

It is a further object of the present invention to provide an IC module capable of contributing to a further reduction in size of home electric appliances and information devices.

It is a still further object of the present invention to provide an IC module capable of constituting a semiconductor component high in reliability of the connection between two IC modules and capable of easily correcting a poor connection between two IC modules.

According to the present invention, in the first aspect thereof, there is provided a semiconductor component comprising an IC module and a mounting substrate with the IC module mounted thereon, the IC module comprising an IC module body with two semiconductor chips sealed therein, interchip connecting inner leads disposed between the two semiconductor chips and connected electrically to the chips, and outer leads drawn out from two or more of our or more side faces of the IC module body up to positions flush with the underside of the IC module body.

The semiconductor component in the first aspect of the present invention can contribute to a further reduction in size of home electric appliances and information devices.

In the second aspect of the present invention there is provided a semiconductor component comprising two IC modules and a mounting substrate with the IC modules mounted thereon, the IC modules each comprising an IC module body with a semiconductor chip sealed therein, first outer leads for connection between the IC modules, the first outer leads being drawn out horizontally to the exterior of the IC module body from one or more of four or more side faces of the IC module body, and second outer leads drawn out to the exterior of the IC module body up to positions flush with the underside of the IC module body from two or more of the other side faces than the side faces from which the first outer leads are drawn out, the first outer leads of the IC modules being connected with each other in the air.

The semiconductor component in the second aspect of the invention can contribute to a further reduction in size of home electric appliances and information devices. Further, the reliability of connection between the two IC modules is high and it is easy to correct a poor connection between the two IC modules.

In the third aspect of the present invention there is provided an IC module comprising an IC module body with two semiconductor chips sealed therein, interchip connecting inner leads disposed between the two semiconductor chips and connected electrically to the chips, and outer leads drawn out from two or more of four or more side faces of the IC module body up to positions flush with the underside of the IC module body.

The IC module in the third aspect of the invention can contribute to a further reduction in size of home electric appliances and information devices.

In the fourth aspect of the present invention there is provided an IC module comprising an IC module body with semiconductor chips sealed therein, first outer leads for intermodule connection drawn out horizontally to the exterior of the IC module body from one or more of four or more side faces of the IC module body, and second outer leads drawn out to the exterior of the IC module body up to positions flush with the IC module body from two or more of the other side faces than the side faces from which the first outer leads are drawn out.

The IC module in the fourth aspect of the invention can contribute to a further reduction in size of home electric appliances and information devices. Moreover, the reliability of connection between two such IC modules is high and it is easy to correct a poor connection between the two IC modules.

DETAILED DESCRIPTION OF THE PREFERRED EMBODIMENTS

Embodiments of the present invention will be described hereinunder.

First Embodiment

Figure 1A:
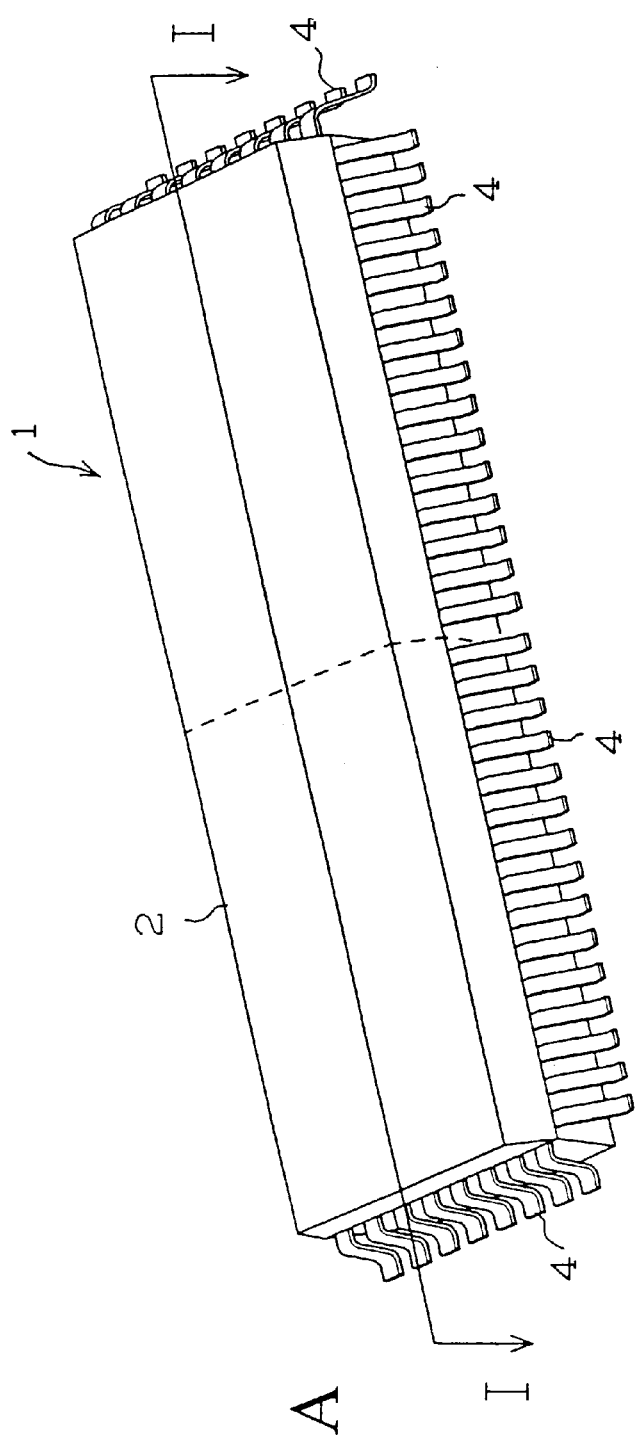
FIGS. 1A and 1B are construction diagrams of an IC module according to the first embodiment of the present invention.
Figure 1B:
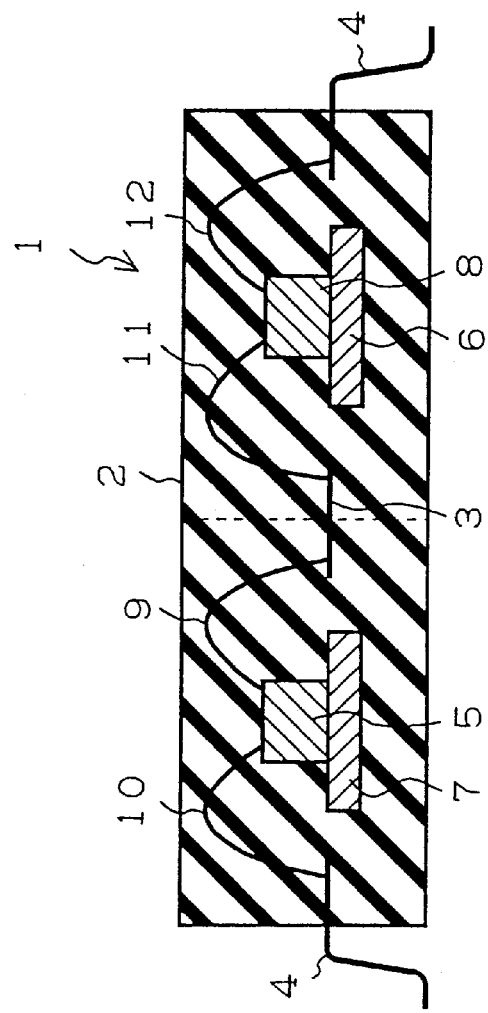

FIGS. 1A and 1B are a construction diagram showing an IC module according to the first embodiment of the present invention. The IC module illustrated in FIGS. 1A and 1B are a combined module obtained by packaging a CPU chip and a memory chip. FIG. 1A is a perspective view and FIG. 1B is a sectional view taken on line I—I in FIG. 1A. In FIGS. 1A and 1B, the reference numeral 1 denotes a combined module (IC module), numeral 5 denotes a CPU chip (semiconductor chip), and numeral 8 denotes a memory chip (semiconductor chip). The CPU chip 5 plays the role of controlling a small-sized device, while the memory chip 8 plays the role of storing data necessary for the CPU chip 5 to control the small-sized device.

Numeral 2 denotes a combined module body (IC module body). Numeral 3 denotes an inner lead for connection between the chips, the inner lead 3 being disposed between the CPU chip 5 and the memory chip 8 and sealed in the combined module body 2. Numeral 4 denotes an outer lead, the outer lead 4 being provided on the combined module body 2 and drawn out to the exterior from four side faces of the combined module body 2 up to positions flush with the underside of the body 2. Numerals 6 and 7 denote substrates for the chips 8 and 5, respectively. Numeral 9 denotes a bonding wire for connecting together the CPU chip 5 and the inner leads 3 both sealed in the combined module body 2. Numeral 10 denotes a bonding wire for connection between the CPU chip 5 sealed in the combined module body 2 and the outer leads 4. Numeral 11 denotes a bonding wire for connection between the memory chip 8 sealed in the combined module body 2 and the inner leads 3. Numeral 12 denotes a bonding wire for connection between the memory chip 8 sealed in the combined module body 2 and the outer leads 4. The inner leads 3 are provided for permitting the CPU chip 5 to receive data from the memory chip 8 and transmit a control signal to the memory chip 8 to control the operation of the memory chip 8 and for permitting the memory chip 8 to receive the control signal from the CPU chip 5 and transmit data to the CPU chip. The outer leads 4 are provided for permitting the CPU chip 5 to be supplied with electric power and receive and transmit an information signal from and to the exterior of the small-sized device and for permitting the memory chip 8 to be supplied with electric power and receive and transmit an information signal from and to the exterior of the small-sized device.

Figure 2:
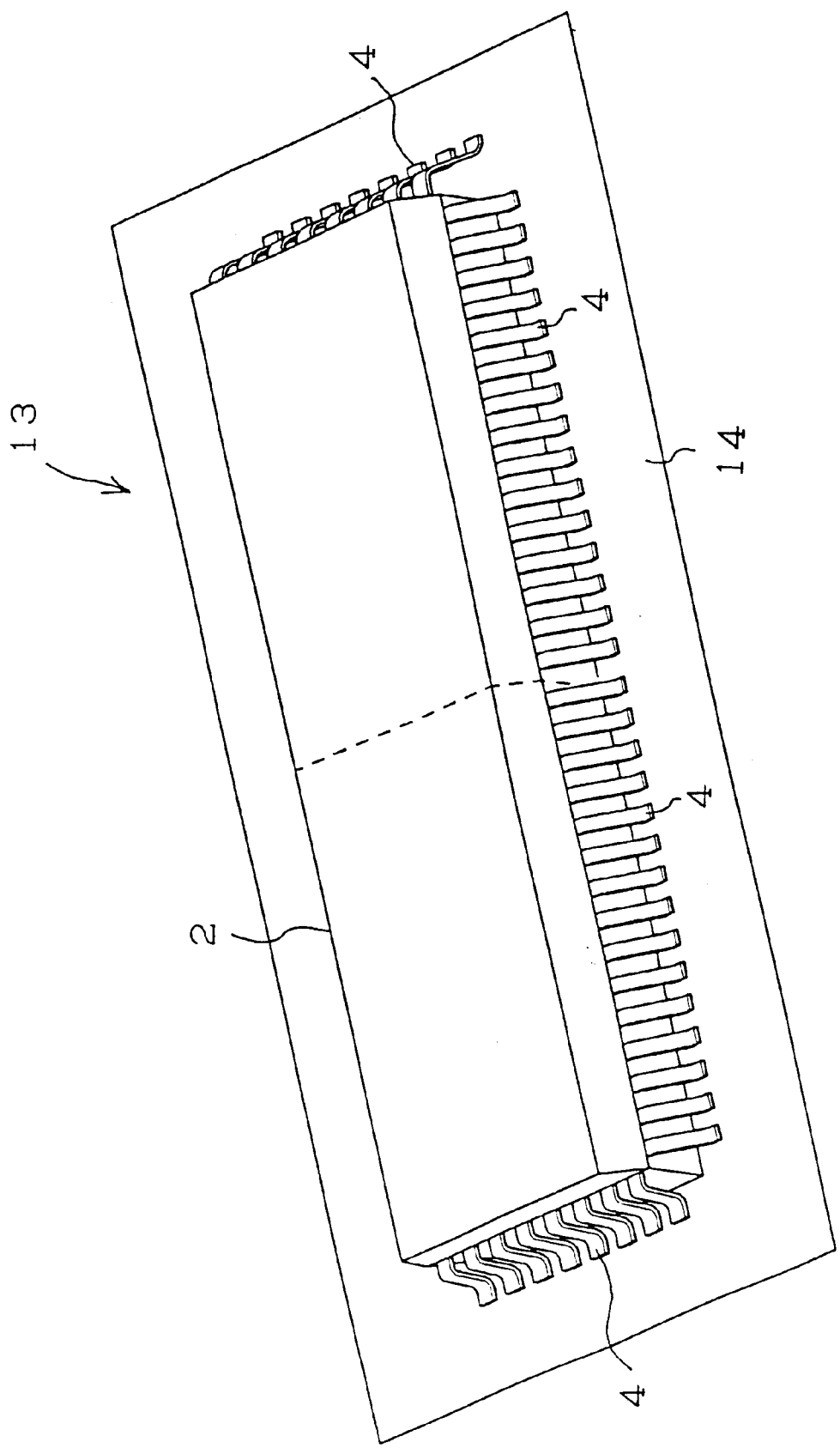
FIG. 2 is a perspective view showing the construction of a semiconductor component according to the first embodiment.

FIG. 2 is a perspective view showing the construction of a semiconductor component according to the first embodiment of the present invention, which is constituted by mounting the combined module shown in FIGS. 1A and 1B onto a mounting substrate. The numeral 13 in FIG. 2 denotes the semiconductor component.

Numeral 14 denotes a mounting substrate. The other constituent elements are the same as those indicated by the same reference numerals as in FIGS. 1A and 1B, so detailed explanations thereof are here omitted.

The semiconductor component 13 is assembled by mounting the combined module 1 onto the mounting substrate 14.

The operation of the semiconductor component 13 will be described below.

Main operations are as follows. The CPU chip 5 transmits a control signal to the memory chip 8 through the inner leads 3 to control the operation of the memory chip 8. The memory chip 6 receives the control signal through the inner leads 3. In accordance with this control signal the memory chip 8 operates and transmits data to the CPU chip 5 through the inner leads 3, which data is necessary for the CPU chip 5 to control the small-sized device. The CPU chip 5 receives the data through the inner leads 3. In accordance with the data the CPU chip 5 controls the small-sized device and transmits an information signal to the exterior of the small-sized device through the outer leads 4.

Thus, the IC module according to the first embodiment comprises an IC module body with two semiconductor chips sealed therein and the inner leads disposed between the two semiconductor chips and connected electrically to the chips. Therefore, unlike the prior art, it is not necessary to ensure a space for connecting wires on the supper surface of the mounting substrate, and there can be obtained an effect contributing to the reduction in size of home electric appliances and information devices.

Besides, since the IC module is of a construction wherein two semiconductor chips are connected together using inner leads disposed between the semiconductor chips, there is obtained an affect that the reliability of connection between the two semiconductor chips is high.

Moreover, according to the construction of the IC module, outer leads are drawn out to the exterior from four side faces of the IC module up to positions flush with the underside of the IC module body. Thus, there is obtained an effect that the stability of the IC module as mounted on the mounting substrate is high. Such an effect is attained if outer leads are drawn out to the exterior from at least two side faces of the IC module body up to positions flush with the underside of the IC module body.

The semiconductor component according to the first embodiment is constituted by mounting an IC module onto a mounting substrate, the IC module comprising an IC module body with two semiconductor chips sealed therein and inner leads disposed between the two semiconductor chips and connected electrically to the chips. Therefore, unlike the prior art, it is not necessary to form bonding wires on the upper surface of the mounting substrate, and such a semiconductor component can contribute to the reduction in size of home electric appliances and information devices.

Further, since the semiconductor component is of a construction wherein an IC module comprising two semiconductor chips connected together using inner leads disposed between the chips is mounted on a mounting substrate, there can be attained a high reliability of connection between the two semiconductor chips.

Further, according to the construction of the semiconductor component, an IC module having outer leads drawn out to the exterior from four side faces of the IC module body up to positions flush with the underside of the IC module body is mounted on a mounting substrate. Thus, there can be attained a high stability of the IC module on the substrate. Such an affect is obtained if the IC module mounted on the substrate is of a construction wherein outer leads are drawn out to the exterior from at least two side faces of the IC module body up to positions flush with the underside of the IC module body.

Figure 3:
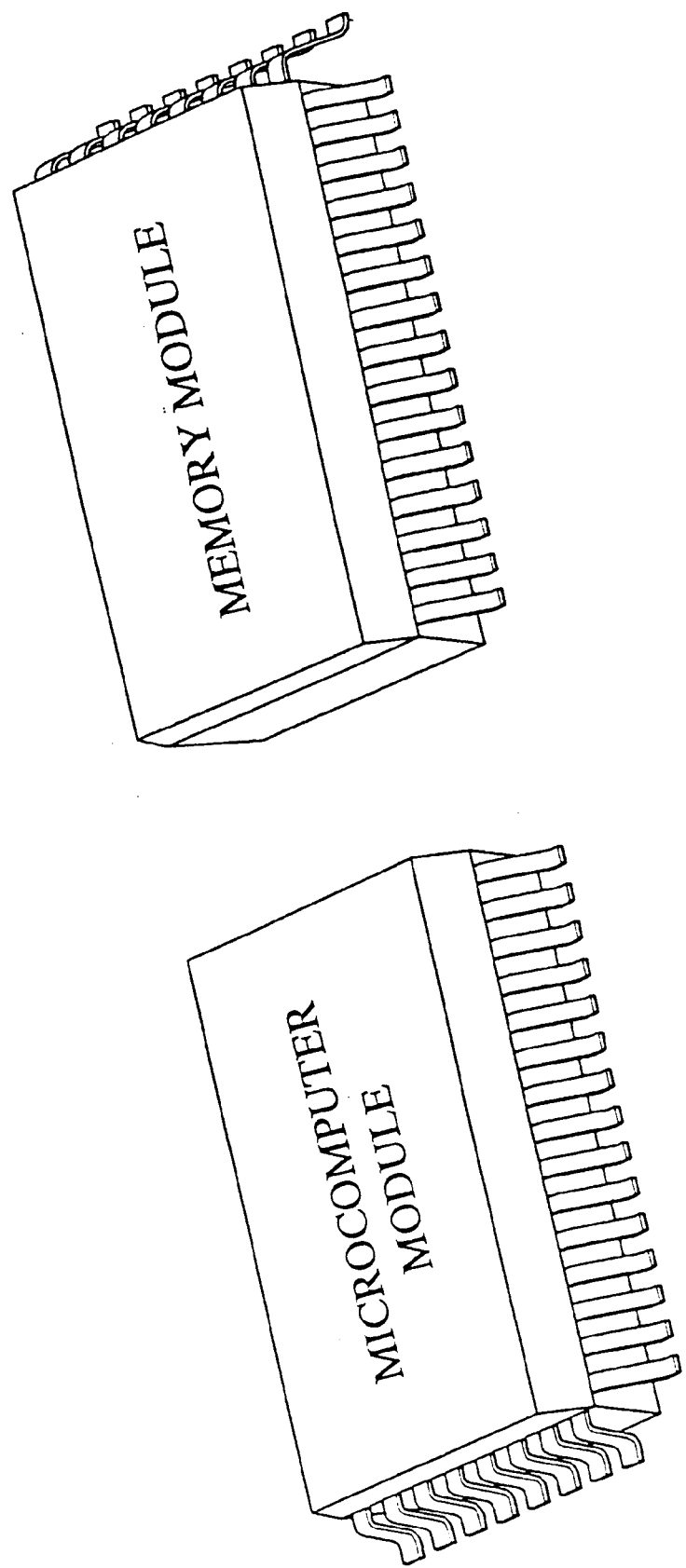
FIG. 3 is a perspective view showing a divided state of the IC module according to the first embodiment.

If the combined module according to the first embodiment is divided into the CPU chip and the memory chip, it can be used as both a microcomputer module and a memory module. FIG. 3 shows a state divided along the position indicated with a dotted line in FIGS. 1A and 1B. In this case, it is necessary that outer leads for connection between the microcomputer module and the memory module be provided beforehand on side faces of the combined module so as to permit connection between both modules after the division through wires provided on the upper surface of the mounting substrate.

Second Embodiment

Figure 4:
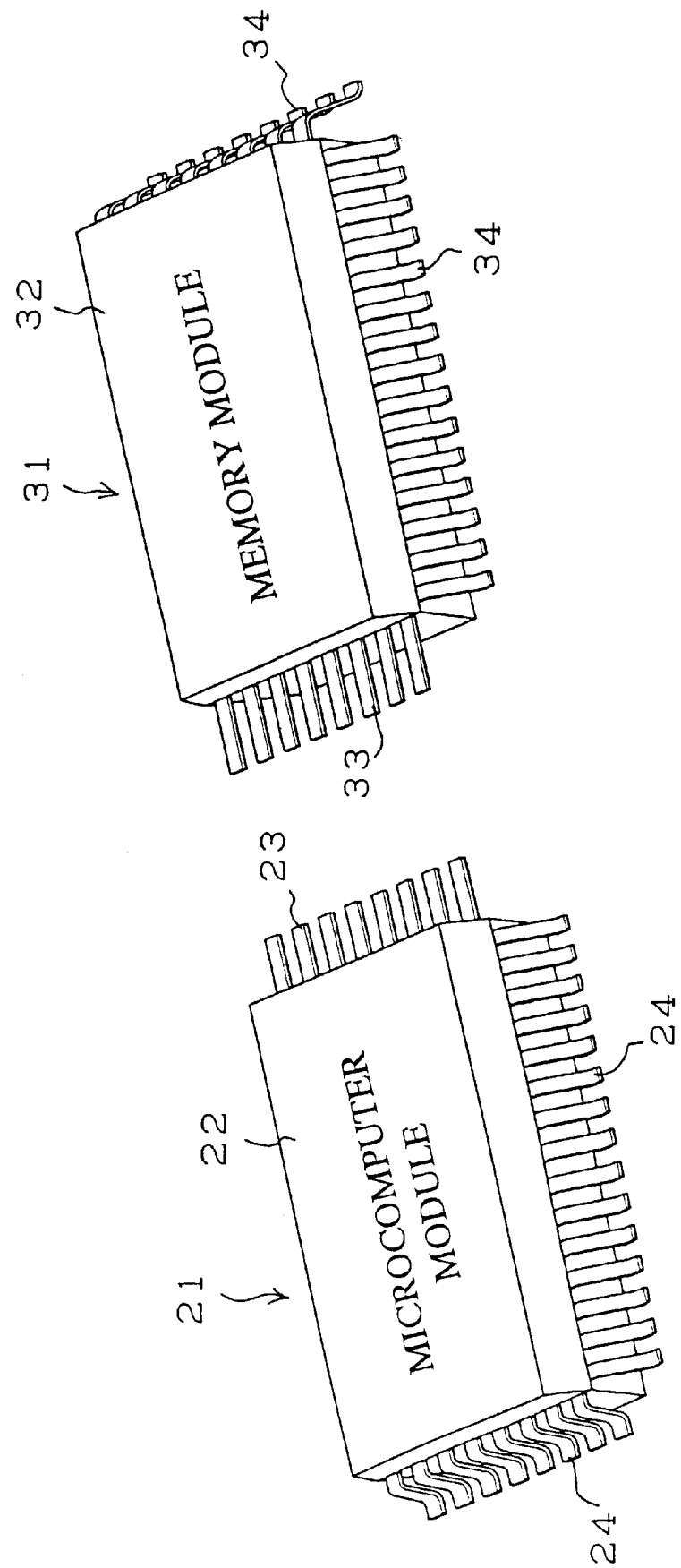
FIG. 4 is a perspective view showing the construction of IC modules according to the second embodiment of the present invention.

FIG. 4 is a perspective view showing the construction of IC modules according to the second embodiment of the present invention, in which are illustrated a microcomputer module (IC module) 21 and a memory module (IC module) 31. The microcomputer 21 plays the role of controlling a small-sized device, while the memory module 31 plays the role of storing data necessary for the microcomputer module 21 to control the small-sized device.

In FIG. 4, the numeral 22 denotes a microcomputer module body (IC module body), numeral 23 denotes a first outer lead for connection between both modules, the first outer lead 23 being drawn out horizontally to the exterior from one side face of the microcomputer module body 22, and numeral 24 denotes a second outer lead drawn out to the exterior from three side faces of the microcomputer module body 22 up to positions flush with the underside of the body 22. The first outer leads 23 are for permitting the microcomputer module 21 to receive data from the memory module 31 and transmit a control signal to the memory module 31 to control the operation of the memory module. The second outer leads 2, are for permitting the microcomputer module 21 to be supplied with electric power and receive and transmit an information signal from and to the exterior of the small-sized device.

The numeral 32 denotes a memory module body (IC module body), numeral 33 denotes a first outer lead for connection between both modules, the first outer lead 33 being provided on the memory module body 32 and drawn out horizontally to the exterior from one side face of the memory module body 32, and numeral 3, denotes a second outer lead provided on the memory module body 32 and drawn out to the exterior from three side faces of the memory module body 32 up to positions flush with the underside of the memory module body 32. The first outer leads 33 are for permitting the memory module 31 to receive a control signal from the microcomputer module 21 and transmit data to the microcomputer module 21. The second outer leads 34 are for permitting the memory module 31 to be supplied with electric power and receive an information signal from the exterior of the small-sized device.

The CPU chip sealed in the microcomputer module body 22 and the first and second outer leads 23, 24 are electrically connected with each other. Likewise, the memory chip sealed in the memory module body 32 and the first and second outer leads 33, 34 are electrically connected with each other.

Figure 5:
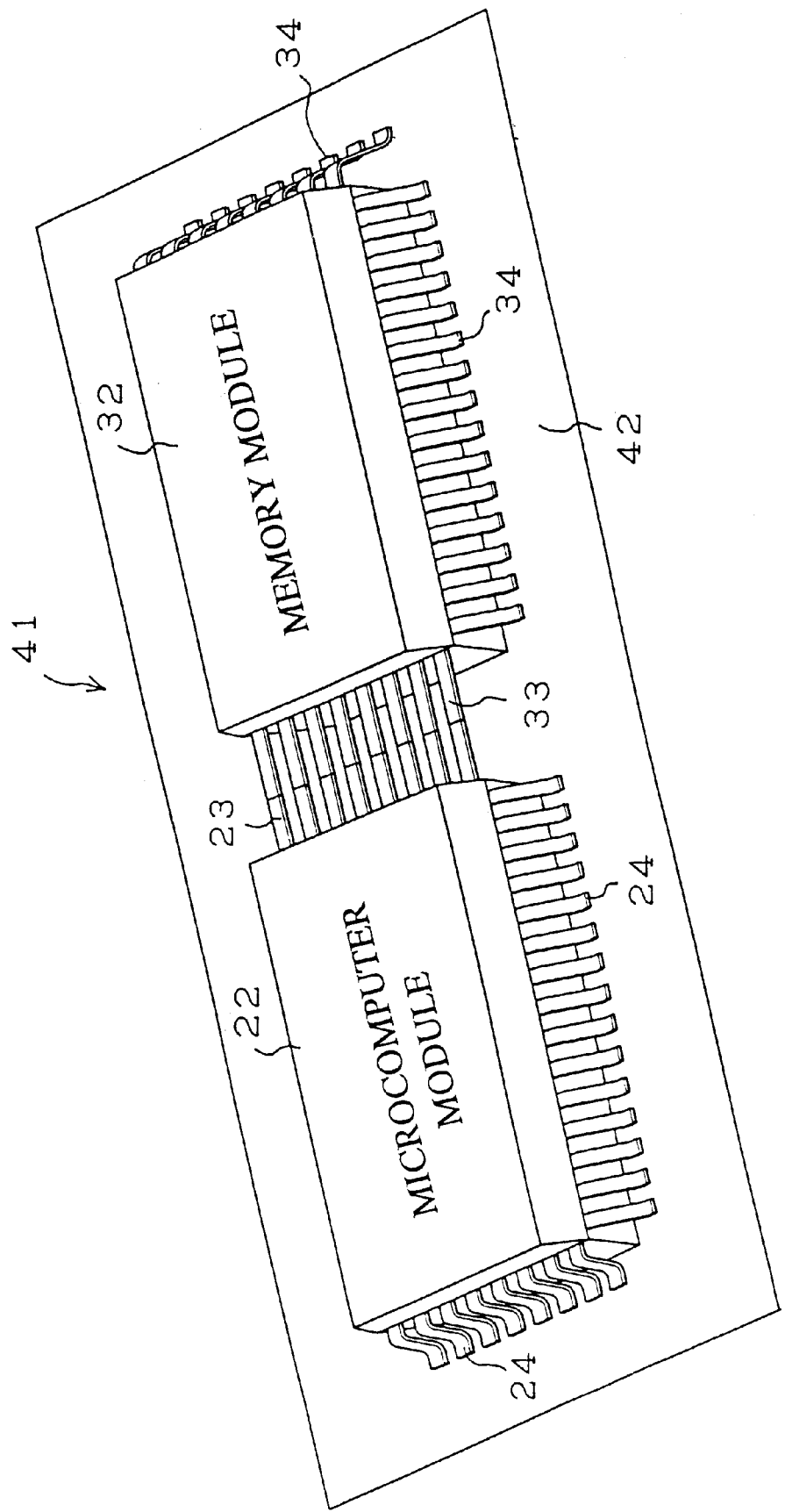
FIG. 5 is a perspective view showing the construction of a semiconductor component according to the second embodiment.

FIG. 5 is a perspective view showing the construction of a semiconductor component according to the second embodiment of the present invention, which component is constituted by mounting the microcomputer module and the memory module both shown in FIG. 4 onto a mounting substrate. In FIG. 5, the numeral 41 represents the semiconductor component and numeral 42 represents the mounting substrate. The other constituent elements are the same as those indicated by the same reference numerals in FIG. 4, so detailed explanations thereof are here omitted.

The semiconductor component 41 is assembled by mounting the microcomputer module 21 and the memory module 31 onto the substrate 42 so that the first outer leads 23 of the microcomputer module 21 and the first outer leads 33 of the memory module 31 opposed thereto are connected together in an overlapped manner. Alternatively, the microcomputer module 21 and the memory module 31 are mounted on the substrate 42 so that the respective first outer leads 23 and 33 are connected together in an overlapped manner, then the overlapped portions of both outer leads are bonded together using solder or the like.

The operation of the semiconductor component according to the second embodiment will be described below.

Main operations are as follows. The microcomputer module 21 transmits a control signal to the memory module 31 through the outer leads 23 to control the operation of the memory module 31. The memory module 31 receives the control signal through the outer leads 33. In accordance with this control signal the memory module 31 operates and transmits data to the microcomputer module 21 through the first outer leads 33, which data is necessary for the microcomputer module 21 to control the small-sized device. The microcomputer module 21 receives the data through the first outer leads 23. In accordance with the data thus received the microcomputer module 21 controls the small-sized device and transmits a control signal to the exterior of the small-sized device through the second outer leads 24.

Thus, the IC modules according to the second embodiment each comprise an IC module body with a semiconductor chip sealed therein and first outer leads drawn out horizontally to the exterior of the IC module body from one side face of the same body. Therefore, unlike the prior art, it is not necessary to ensure the space for connecting wires on the upper surface of the mounting substrate. Thus, the IC modules in question can contribute to the reduction in size of home electric appliances and information devices. Further, in assembling the semiconductor component of the embodiment, there is no fear that adjacent first outer lead connections may be connected together. In correcting a poor connection between both IC modules, therefore, there is attained a high reliability of connection between the IC modules. Thus, the semiconductor component in question permits easy correction of a poor connection between the two IC modules.

Moreover, since the IC modules according to the second embodiment are each of a construction such that the second outer leads are drawn out to the exterior from three side faces of the IC module body up to positions flush with the underside of the IC module body, there is attained a high stability of the IC module when mounted on the substrate. Such an effect is obtained if the outer leads are drawn out to the exterior from at least tow side faces of the IC module body up to positions flush with the underside of the IC module body.

According to the construction of the semiconductor component of the second embodiment, two IC modules each comprising an IC module body with a semiconductor chip sealed therein and first outer leads drawn out horizontally to the exterior of the IC module body from one side face of the IC module body are mounted on a mounting substrate, then the first outer leads of one IC module and the first outer leads o the other IC module opposed thereto are overlapped and connected with each other in the air. Therefore, unlike the prior art, it is not necessary to provide connecting wires on the mounting substrate, that is, the semiconductor component in question can contribute to the reduction in size of home electric appliances and information devices. Further, there is no fear that adjacent first outer lead connections may be connected together, so in the case of correcting a poor connection between the IC modules, there can be attained a highly reliable connection between the two IC modules and it is easy to correct a poor connection between the two IC modules.

According to the construction of the semiconductor component in question, moreover, two IC modules are mounted on a substrate and each having second outer leads drawn out to the exterior from three side faces of the IC module body up to positions flush with the underside of the IC module body. This construction brings about the effect that the semiconductor component is highly stable when mounted on the substrate. Such an affect is obtained if only on a substrate are mounted two IC modules each of a construction such that outer leads are drawn out to the exterior from at least two side faces of the IC module body up to positions flush with the underside of the IC module body.

Third Embodiment

Figure 6:
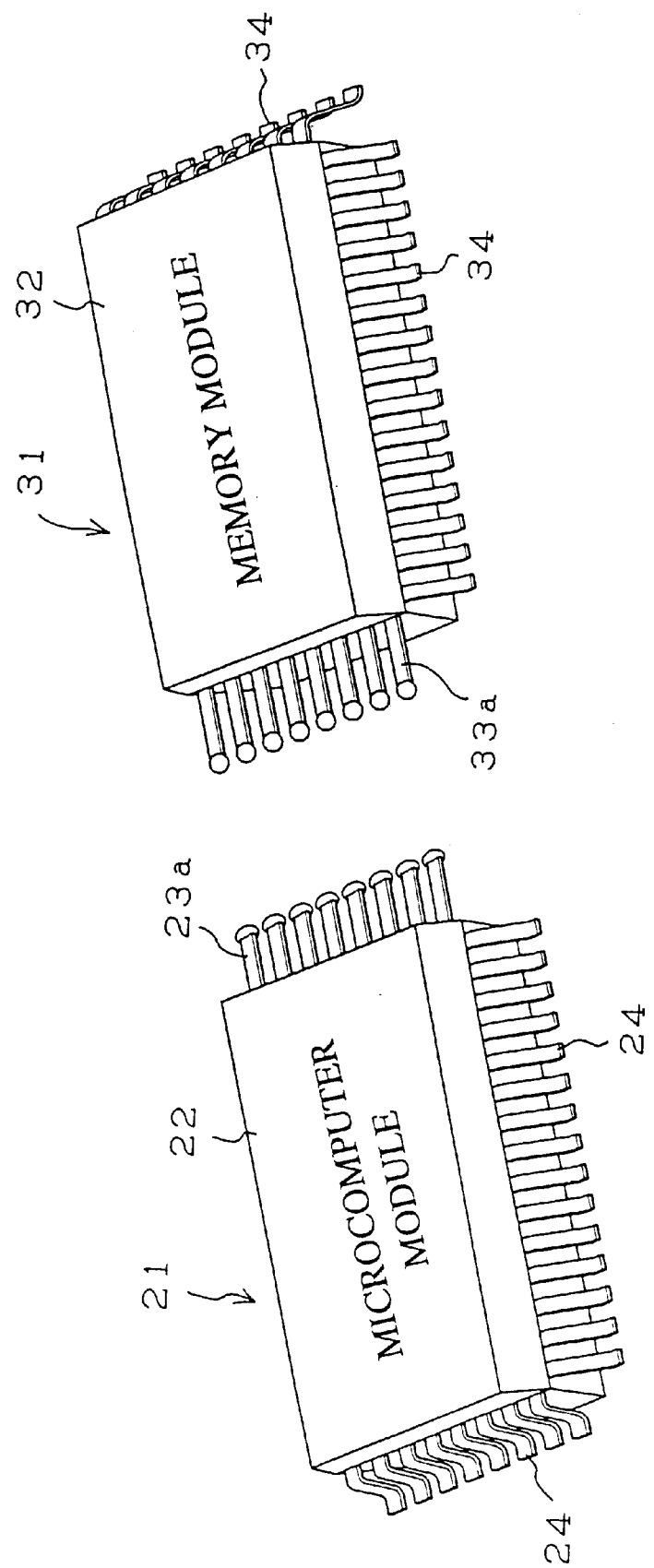
FIG. 6 is a perspective view showing the construction of IC modules according to the third embodiment of the present invention.
Figure 7:
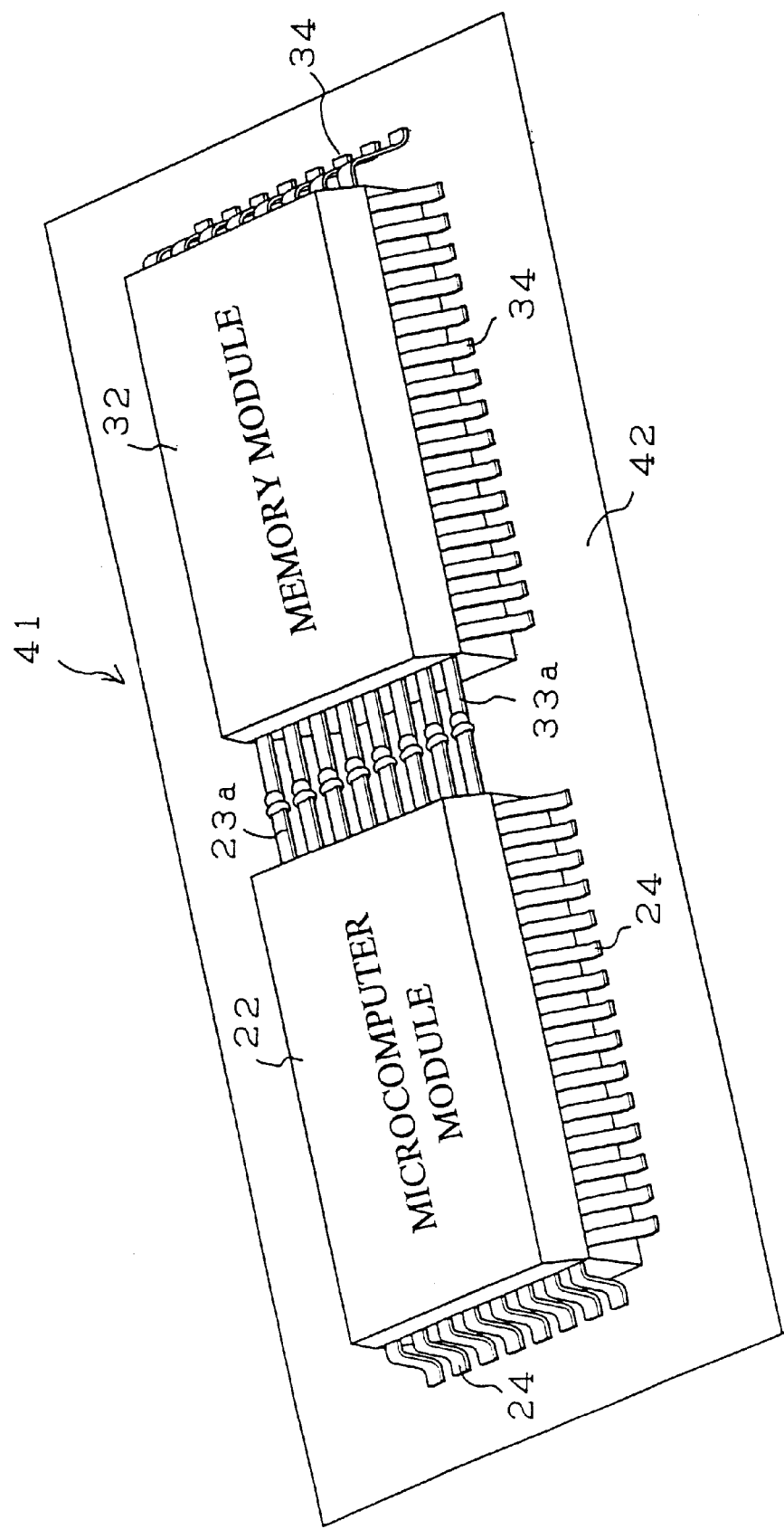
FIG. 7 is a perspective view showing the construction of a semiconductor component according to the third embodiment.

FIG. 6 is a perspective view showing the construction of IC modules according to the third embodiment of the present invention. FIG. 7 is a perspective view showing the construction of a semiconductor component according to the third embodiment of the present invention, which component has been assembled by mounting both microcomputer module and memory module shown in FIG. 6 onto a mounting substrate. In FIGS. 6 and 7, the numeral 23a denotes a first outer lead for connection between both modules, the first outer lead 23a being provided on a microcomputer module body 22 and drawn out horizontally to the exterior from one side face of the microcomputer module body, the first outer lead 23a having a concave front end. Numeral 33a denotes a first outer lead for connection between both modules, the first outer lead 33a being provided on a memory module body 32 and drawn out horizontally to the exterior from one side face of the memory module body, the first outer lead 33a having a convex front end. The other constituent elements are the same as or equal to those indicated by the same reference numerals in FIG. 4 or 5, so detailed explanations thereof are here omitted.

A semiconductor component 41 according to the third embodiment of the present invention is shown in FIG. 7. The semiconductor component 41 is assembled by mounting the microcomputer module 21 and the memory module 31 both shown in FIG. 6 onto a mounting substrate 42 in such a manner that the convex front end portions of the first outer leads 33a of the memory module 31 are fitted in and connected to the concave front end portions of the first outer leads 23a of the microcomputer module 21 opposed thereto. Alternatively, after the microcomputer module 21 and the memory module 31 have been mounted on the substrate in the above manner, the front end portions of the first outer leads 33a and 23a connected together by fitting are bonded using solder or the like.

Thus, according to the construction of the semiconductor component of the third embodiment, both IC module provided with first outer leads having convex front ends and IC module provided with first outer leads having concave front ends are mounted on a substrate, then the convex front end portions of the first outer leads of one IC module are fitted in the concave front end portions of the first outer leads of the other IC module opposed thereto, thus the outer leads of both IC modules are connected together in the air.

According to this third embodiment there are obtained the same effects as in the second embodiment.

Fourth Embodiment

Figure 8:
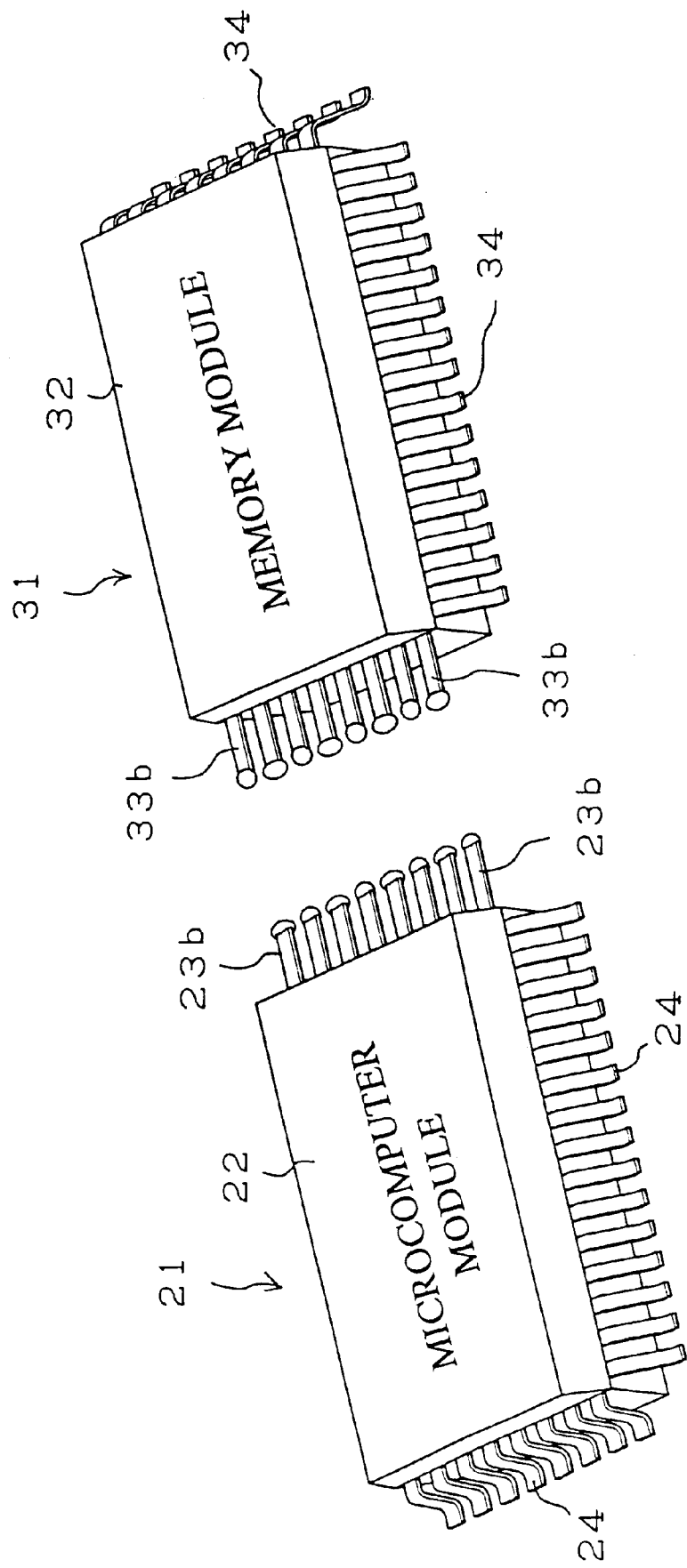
FIG. 8 is a perspective view showing the construction of IC modules according to the fourth embodiment of the present invention.
Figure 9:
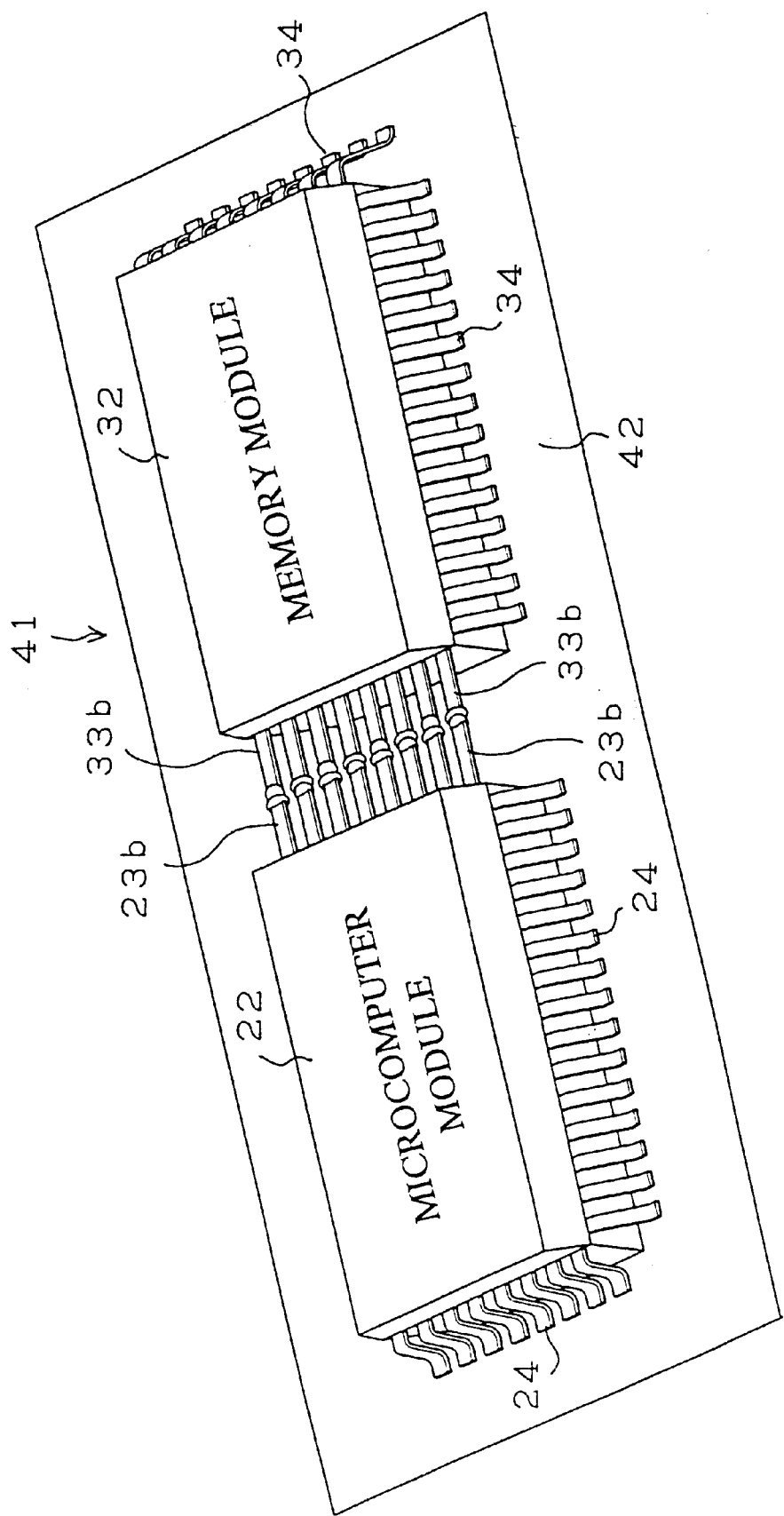
FIG. 9 is a perspective view showing the construction of a semiconductor component according to the fourth embodiment.

FIG. 8 is a perspective view showing the construction of a microcomputer module and a memory module as IC modules according to the fourth embodiment of the present invention, and FIG. 9 is a perspective view showing the construction of a semiconductor component according to the fourth embodiment of the present invention, which has been assembled by mounting the microcomputer module and the memory module both shown in FIG. 8. In FIGS. 8 and 9, the numeral 23b denotes a first outer lead for connection between both modules, the first outer lead 23b being provided on a microcomputer module body 22 and drawn out horizontally to the exterior from one side face of the microcomputer module body, the first outer lead 23b having a convex or concave front end. Numeral 33b denotes a first outer lead provided on a memory module body 32 and drawn out horizontally to the exterior from one side face of the memory module body, the first outer lead 33b having convex or concave front end. The other constituent elements are the same as or equal to those indicated by the same reference numerals in FIG. 4 or 5, so detailed explanations thereof are here omitted.

A semiconductor component 41 according to the fourth embodiment of the present invention is assembled by mounting the microcomputer module 21 and the memory module 31 both shown in FIG. 8 onto a mounting substrate 42 in such a manner that the convex front end portions of the first outer leads 33b of the memory module 31 are fitted in and connected to the concave front end portions of the first outer leads 23b of the microcomputer module 21 opposed thereto, while the convex front end portions of the first outer leads 23b of the microcomputer module 21 are fitted in and connected to the concave front end portions of the first outer leads 33b of the memory module 31. Alternatively, after the microcomputer module 21 and the memory module 31 have been mounted on the substrate 42 in the above manner, the fitted and connected portions between the convex and concave front end portions of the first outer leads 33b and 23b, respectively, of the memory module 31 and the microcomputer module 21, as well as the fitted and connected portions between the convex and concave front end portions of the first outer leads 23b and 33b, respectively, of the microcomputer module 21 and the memory module 31, are bonded together using solder or the like.

Thus, according to the construction of the semiconductor component of the fourth embodiment, two IC modules each provided with first outer leads having convex front ends and first outer leads having concave front ends, both first outer leads being arranged in an alternate manner, are mounted on a substrate, then the convex front end portions of the first outer leads of one IC module are fitted in the concave front end portions of the first outer leads of the other IC module, while the convex front end portions of the first outer leads of the other IC module are fitted in the concave front end portions of the one IC module, thus the first outer leads of both IC modules are connected together in the air.

According to this fourth embodiment there are obtained the same effects as in the second embodiment.

Fifth Embodiment

Figure 10:
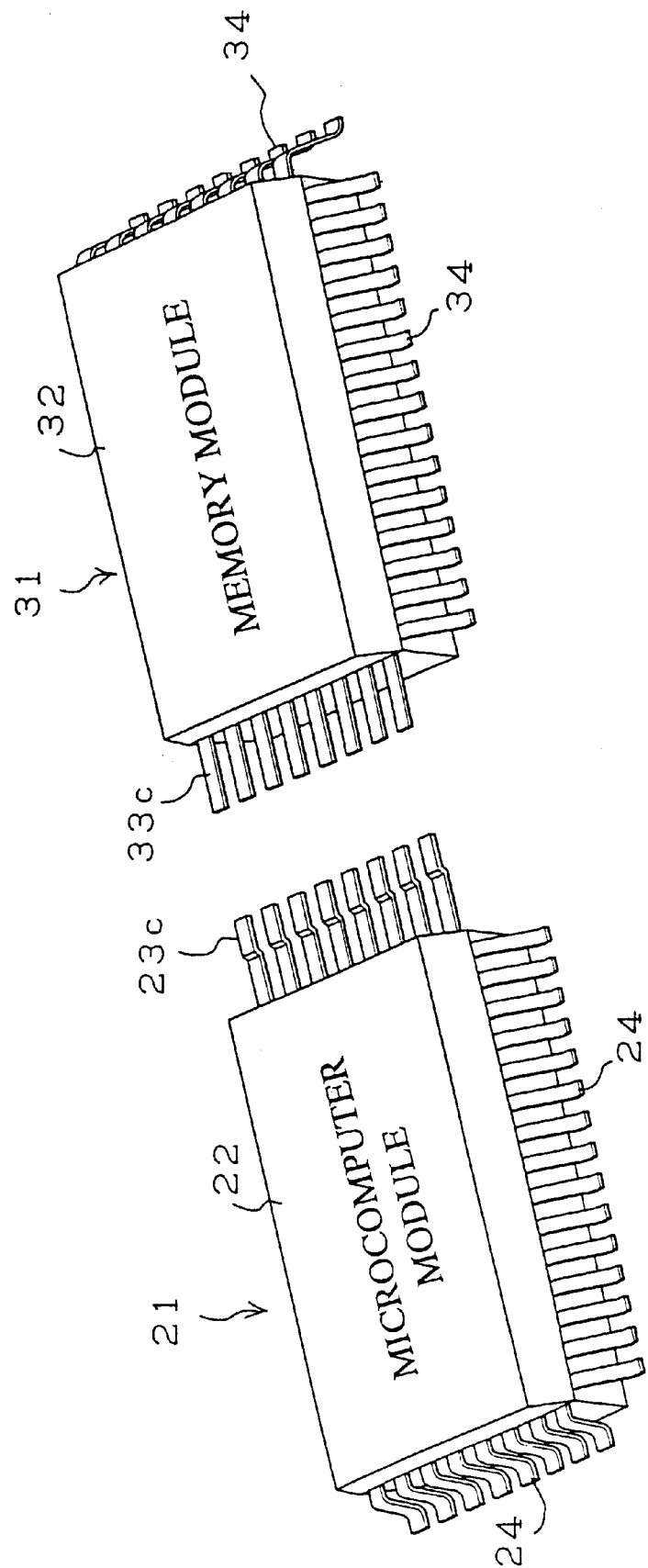
FIG. 10 is a perspective view showing the construction of IC modules according to the fifth embodiment of the present invention.
Figure 11:
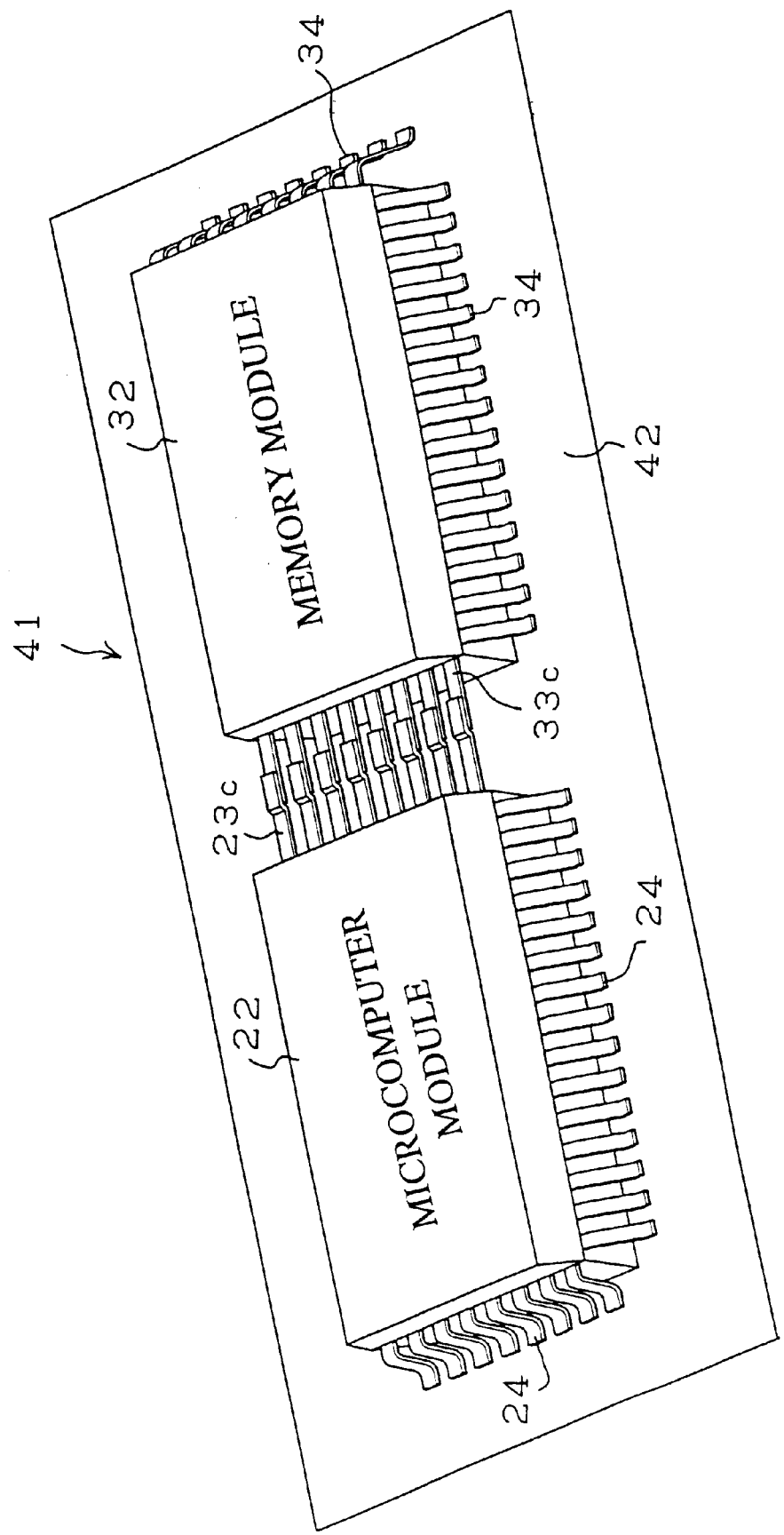
FIG. 11 is a perspective view showing the construction of a semiconductor component according to the fifth embodiment.

FIG. 10 is a perspective view showing the construction of IC modules according to the fifth embodiment of the present invention, the IC modules being a microcomputer module and a memory module. FIG. 11 is a perspective view showing the construction of a semiconductor component according to the fifth embodiment of the present invention. The semiconductor component has been assembled by mounting the microcomputer module and the memory module both shown in FIG. 10 onto a mounting substrate. In FIGS. 10 and 11, the numeral 23c denotes a first outer lead for connection between both modules, the first outer lead 23c being provided on a microcomputer module body 22 and drawn out horizontally to the exterior from one side face of the microcomputer module body, the first outer lead 23c having a stepwise raised front end portion. Numeral 33c denotes a first outer lead for connection between both modules, the first outer lead 33c being provided on a memory module bode 32 and drawn out to the exterior horizontally from one side face of the memory module body. The other constituent elements are the same as or equal to those indicated by the same reference numerals in FIG. 4 or FIG. 5, so detailed explanations thereof are here omitted.

According to the construction of the semiconductor component 41 of the fifth embodiment illustrated in FIG. 11, the microcomputer module 21 and the memory module 31 are mounted on the substrate 42 in such a manner that the front ends of the first outer leads 33c of the memory module 31 get into the space under the stepwise raised front end portions of the first outer leads 23c of the microcomputer module 21 opposed thereto and are connected to such front ends of the first outer leads 23c. Alternatively, after both modules have been mounted on the substrate in the above manner, the connected portions of both front end portions are bonded together using solder for example.

Thus, the semiconductor component according to the fifth embodiment is constructed as follows. An IC module provided with first outer leads having front ends as drawn out horizontally and an IC module provided with first outer leads having stepwise raised front end portions are mounted on a substrate, then the front ends of the first outer leads of one IC module are brought into the space under the stepwise raised front and portions of the first outer leads of the other IC module, and the first outer leads of both IC modules are connected together in the air.

According to this fifth embodiment there are obtained the same effects as in the second embodiment.

Sixth Embodiment

Figure 12:
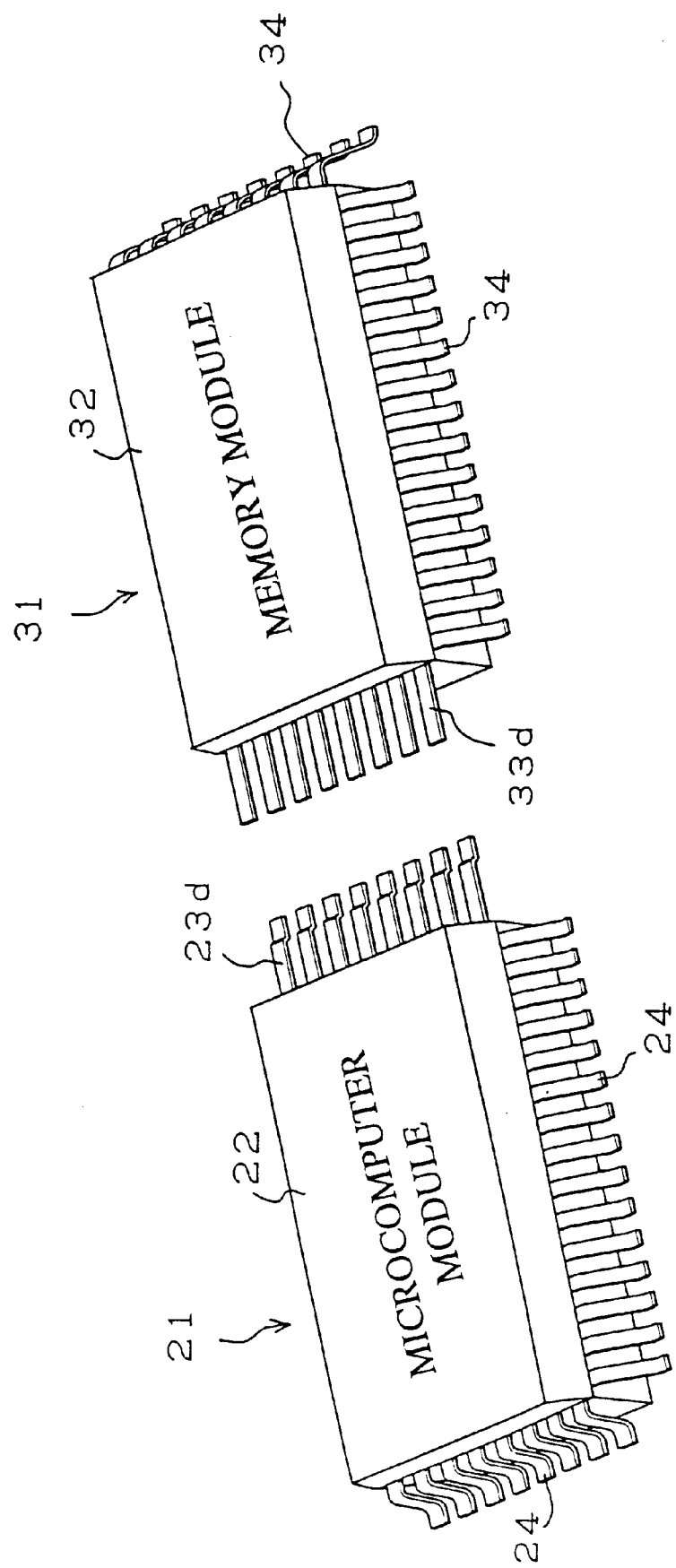
FIG. 12 is a perspective view showing the construction of IC modules according to the sixth embodiment of the present intention.
Figure 13:
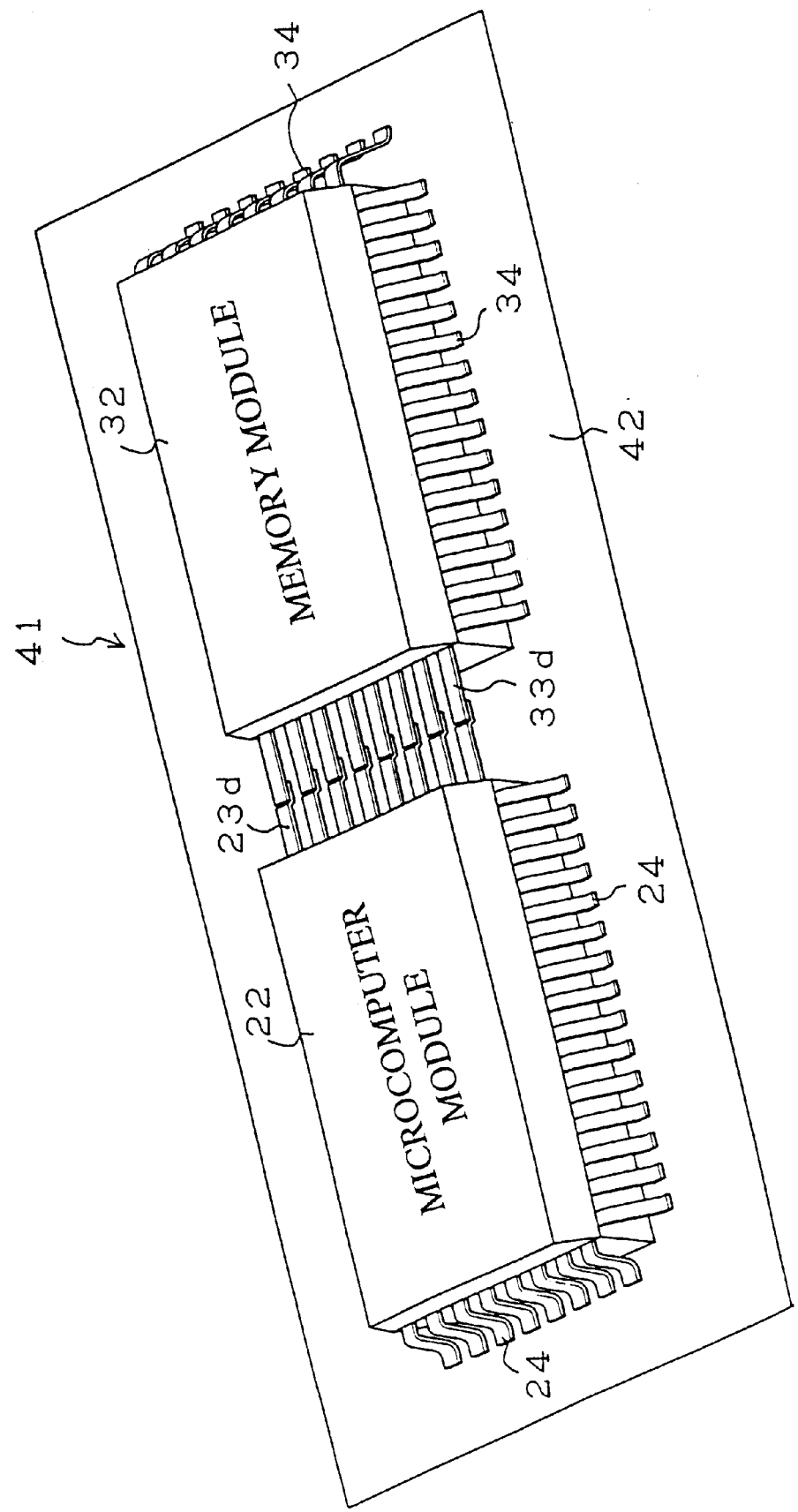
FIG. 13 is a perspective view showing the construction of a semiconductor component according to the sixth embodiment.

FIG. 12 is a perspective view showing the construction of IC modules according to the sixth embodiment of the present invention, the IC modules being a microcomputer module 21 and a memory module 31. FIG. 13 is a perspective view showing the construction of a semiconductor component according to this sixth embodiment of the invention, which has been assembled by mounting the microcomputer module and the memory module 31 both shown in FIG. 12 onto a mounting substrate. In FIGS. 12 and 13, the numeral 23*d* denotes a first outer lead for connection between both modules, the first outer lead 23*d* being provided on a microcomputer module body 22 and drawn out to the exterior from one side face of the body 22, the first outer lead 23*d* having a stepwise lowered front end portion. Numeral 33*d* denotes a first outer lead for connection between both modules, the first outer lead 33*d* being provided on a memory module body 32 and drawn out to horizontally to the exterior from one side face of the memory module body 32. The other constituent elements are the same as or equal to those indicated by the same reference numerals in FIG. 4 or 5, so detailed explanations thereof are here omitted.

The semiconductor component 41 according to the sixth embodiment of the present invention is assembled by mounting the microcomputer module 21 and the memory module 31 on the substrate 42 in such a manner that the front ends of the first outer leads 33*d* of the memory module 21 get into the space above the stepwise lowered from end portions of the first outer leads 23*d* of the microcomputer module 21 opposed thereto and are connected thereto. Alternatively, after both modules have been mounted on the substrate 42 in the above manner, the front end portions of both first outer leads thus connected together are bonded using solder for example.

Thus, the semiconductor component according to this sixth embodiment is assembled by mounting on a mounting substrate an IC module provided with first outer leads having front ends as drawn out horizontally and an IC module provided with first outer leads having stepwise lowered front end portions, then bringing the front ends of the first outer leads of one IC module into the space above the stepwise lowered front end portions of the first outer leads of the other IC module, and connecting together the first outer leads of both IC modules in the air.

According to this sixth embodiment there are obtained the same effects as in the second embodiment.

Seventh Embodiment

Figure 14:
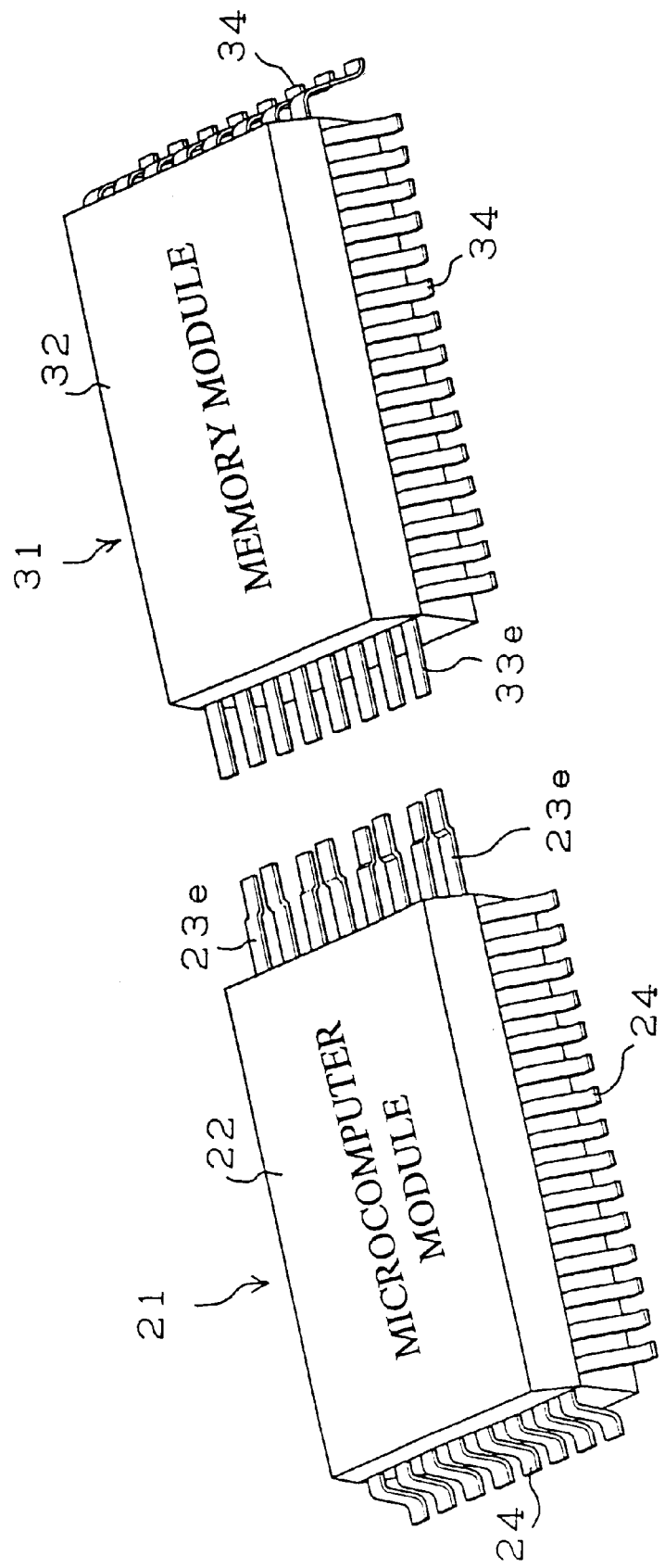
FIG. 14 is a perspective view showing the construction of IC modules according to the seventh embodiment of the present intention.
Figure 15:
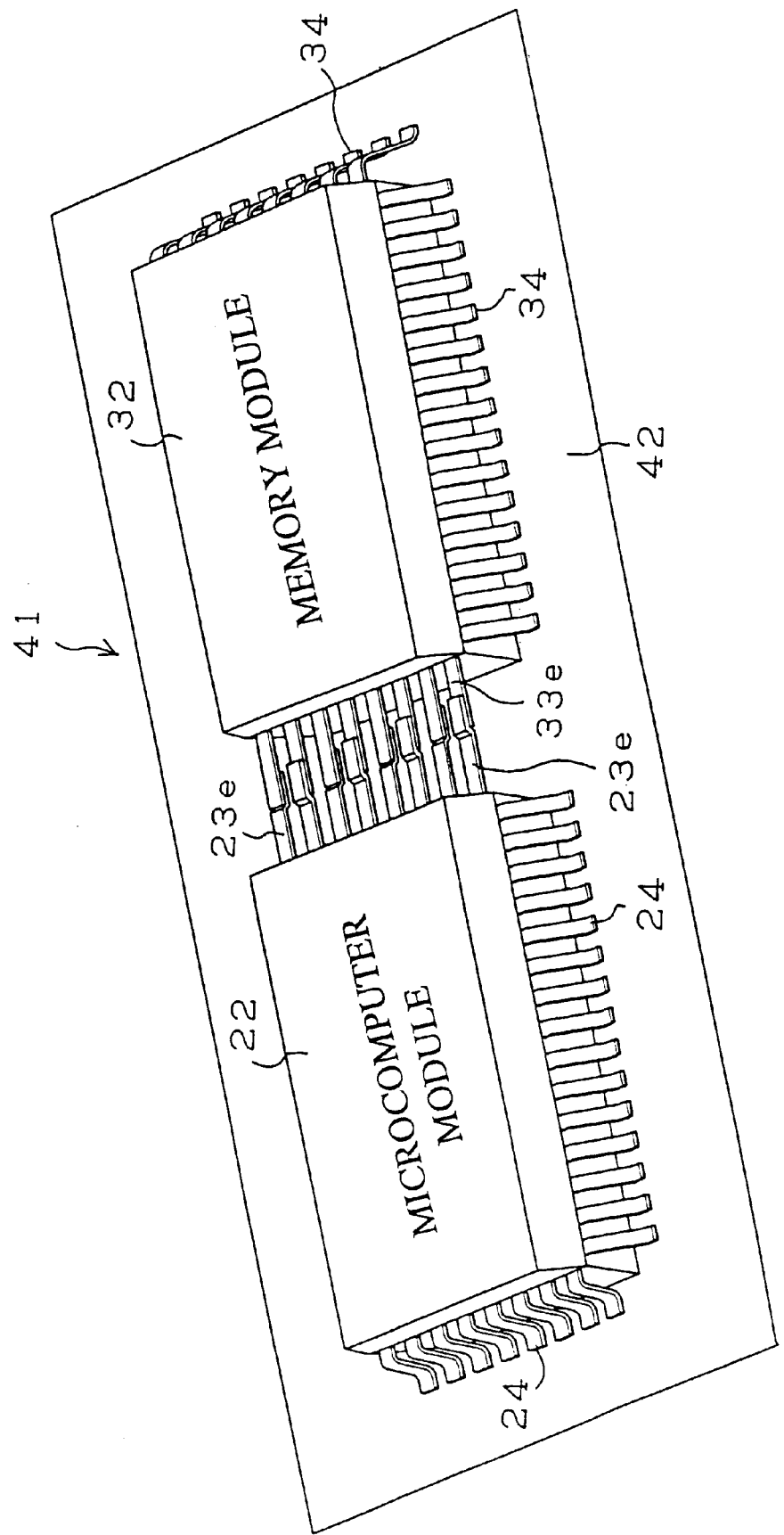
FIG. 15 is a perspective view showing the construction of a semiconductor component according to the seventh embodiment.
Figure 16:
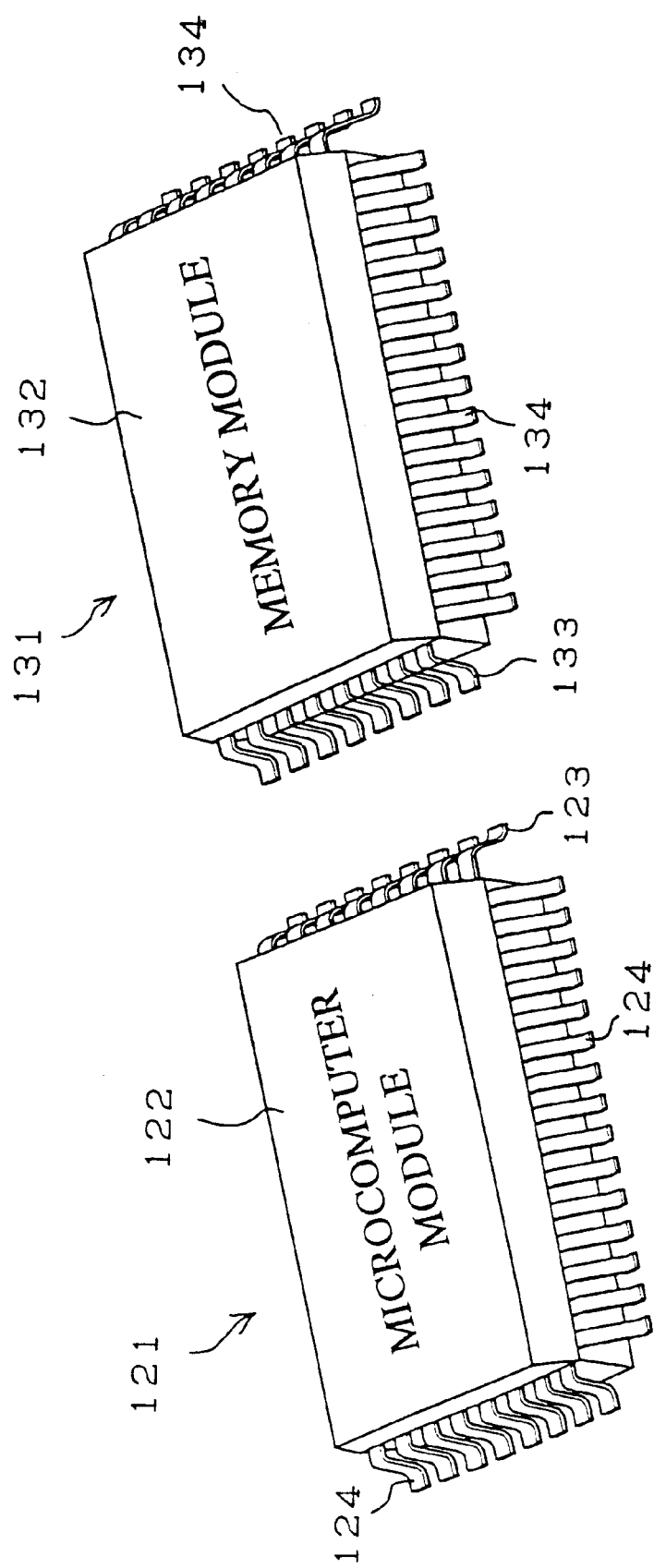
FIG. 16 is a perspective view showing the construction of conventional IC modules.
Figure 17:
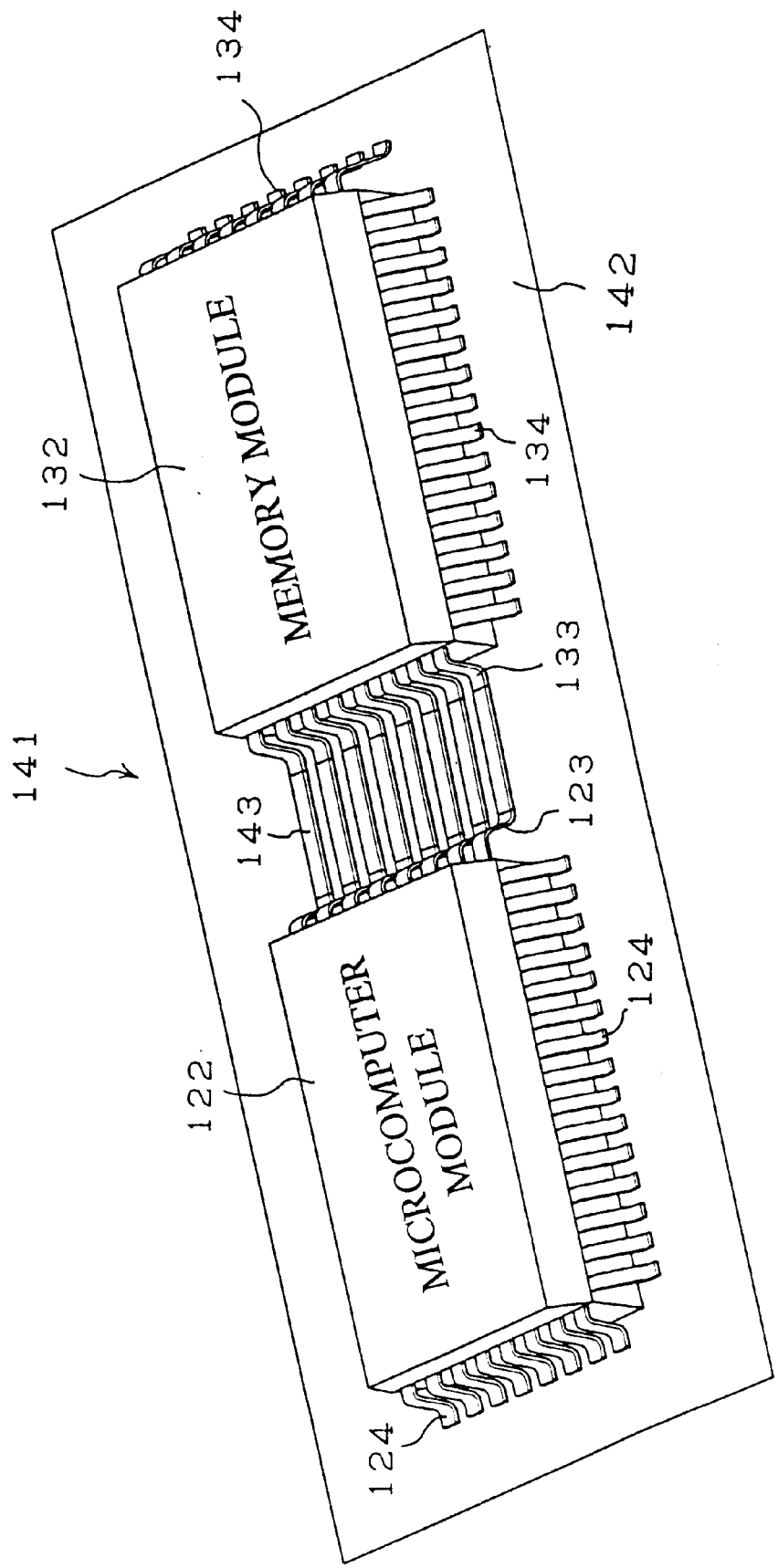
FIG. 17 is a perspective view showing the construction of a conventional semiconductor component.
Figure 18:
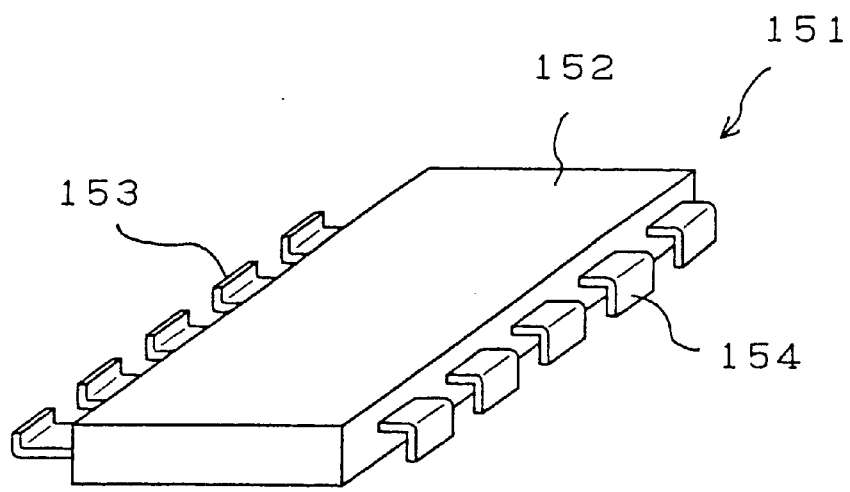
FIG. 18 is a perspective view showing the construction of a conventional IC module disclosed in JP-A No. 2-63150.
Figure 19:
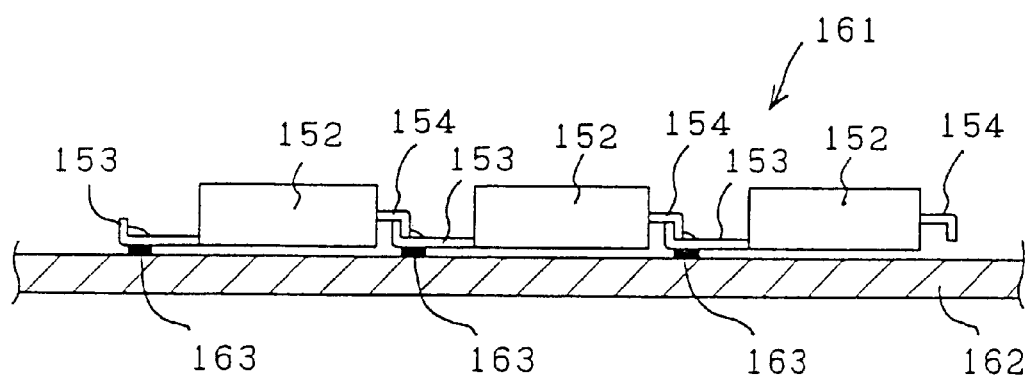
FIG. 19 is a side view showing the construction of a conventional semiconductor component disclosed in JP-A No. 2-63150.

FIG. 14 is a perspective view showing the construction of IC modules according to the seventh embodiment of the present invention, the IC modules being a microcomputer module 21 and a memory module 31. FIG. 15 is a perspective view showing the construction of a semiconductor component according to the seventh embodiment, which is assembled by mounting the microcomputer module and the memory module both shown in FIG. 14 onto a mounting substrate. In FIGS. 14 and 15, the numeral 23*e* denotes a first outer lead for connection between both modules, the first outer lead 23*e* being provided on a microcomputer module body 22 and drawn out to the exterior horizontally from one side face of the body 22, the first outer lead 23*e* having a stepwise raised or lowered front end portion. Numeral 33*e* denotes a first outer lead for connection between both modules, the first outer lead 33*e* being provided on a memory module body 32 and drawn out to the exterior horizontally from one side face of the body 32. The other constituent elements are the same as or equal to those indicated by the same reference numerals in FIG. 4 or 5, so detailed explanations thereof are here omitted.

The semiconductor component 41 according to this seventh embodiment illustrated in FIG. 15 is assembled by mounting the microcomputer module 21 and the memory module 31 on the substrate 42 in such a manner that the front ends of the first outer leads 33*e* of the memory module 31 get into the space under the stepwise raised front end portions or the space above the stepwise lowered front end portions of the first outer leads 23*e* of the microcomputer module 21 opposed thereto. Alternatively, after the microcomputer module 21 and the memory module 31 have been mounted on the substrate 42 in the above manner, the connections of the front ends of the first outer leads 33*e* with the stepwise raised front ends of the first outer leads 23*e* and the connections thereof with the stepwise lowered front ends of the first outer leads 23*e* are bonded using solder for example.

Thus, the semiconductor component according to the seventh embodiment is assembled by mounting on a substrate an IC module provided with first outer leads having front ends as drawn out horizontally and an IC module provided with first outer leads having stepwise raised front ends and first outer leads having stepwise lowered front ends in an alternate manner, than causing the front ends of the first outer leads of one IC module to get into the space under the stepwise raised front ends or the space above the stepwise lowered front ends of the first outer leads of the other IC module opposed thereto, and connecting together the first outer leads of both IC modules in the air.

According to this seventh embodiment there are obtained the same effects as in the second embodiment.

Although the foregoing first embodiment referred to both CPU chip and memory chip as semiconductor chips, and the second to seventh embodiments referred to both IC module and microcomputer module as IC modules, no limitation is placed on the type of semiconductor chips and that of IC modules.

Further, although in the second to seventh embodiments the first outer leads are drawn out from one side face of the IC module body, they may be drawn out from two or more side faces if the second outer leads are drawn out from at least two side faces.

What is claimed is:

1. A semiconductor component comprising:

a first IC module; and a second IC module separate and distinct from said first IC module, said first and second IC modules each comprising an IC module body with a semiconductor chip sealed therein, first outer leads for connection between both said IC modules, said first outer leads drawn out parallel to a plane containing major axes of said IC module to the exterior of said IC module body from at least one side face of the IC module body, and second outer leads drawn out to the exterior of said IC module body up to positions flush with a plane containing the underside of the IC module body from at least two side faces other than the side face from which said first outer leads are drawn out, said first outer leads of both said first and second IC modules being connected together in the air.

2. A semiconductor component according to claim 1, wherein said first outer leads of said first IC module overlap respective said first outer leads of said second IC module when connected in the air.

3. A semiconductor component according to claim 1, wherein said first outer leads of said first IC module overlap and are bonded to respective said first outer leads of said second IC module when connected in the air.

4. A semiconductor component according to claim 1, wherein said first outer leads of said first IC module have convex ends which fit into respective concave ends of said first outer leads of said second IC module when connected in the air.

5. A semiconductor component according to claim 1, wherein said first outer leads of said first IC module have a mixture of convex ends and concave ends which fit into respective concave ends and convex ends of said first outer leads of said second IC module when connected in the air.

6. A semiconductor component according to claim 1, wherein said first outer leads of said first IC module have laterally offset ends which overlap respective ends of said first outer leads of said second IC module when connected in the air.

7. A semiconductor component according to claim 6, wherein said offset ends are raised relative to the rest of the respective first outer leads of said first IC module.

8. A semiconductor component according to claim 6, wherein said offset ends are lowered relative to the rest of the respective first outer leads of said first IC module.

9. A semiconductor component according to claim 6, wherein some of said offset ends are raised relative to the rest of the respective first outer leads of said first IC module and some of said offset ends are lowered relative to the rest of the respective first outer leads of said first IC module.

10. An IC module comprising:
   an IC module body with two semiconductor chips sealed therein;
   inner leads for connection between both said chips, said inner leads being disposed between said semiconductor chips and connected electrically to each of said semiconductor chips; and
   outer leads drawn out from at least two side faces of sad IC module body up to positions flush with a plane containing the underside of the IC module body,
   wherein said IC module is divisible into two parts usable as independent IC modules respectively.

* * * * *